(12) United States Patent
Noori et al.

(10) Patent No.: US 10,784,824 B2
(45) Date of Patent: *Sep. 22, 2020

(54) AMPLIFIERS AND RELATED INTEGRATED CIRCUITS

(71) Applicant: NXP USA, Inc., Austin, TX (US)

(72) Inventors: Basim H. Noori, Chandler, AZ (US);
Gerard J. Bouisse, Toulouse (FR);
Jeffrey K. Jones, Chandler, AZ (US);
Jean-Christophe Nanan, Toulouse (FR); Jaime A. Pla, Scottsdale, AZ (US)

(73) Assignee: NXP USA, Inc., Austin, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/655,749

(22) Filed: Oct. 17, 2019

(65) Prior Publication Data

US 2020/0052661 A1 Feb. 13, 2020

Related U.S. Application Data

(63) Continuation of application No. 15/945,669, filed on Apr. 4, 2018, now Pat. No. 10,483,923, which is a continuation of application No. 15/237,015, filed on Aug. 15, 2016, now Pat. No. 9,941,845, which is a continuation of application No. 14/009,099, filed as application No. PCT/IB2011/001049 on Apr. 20, 2011, now Pat. No. 9,419,566.

(51) Int. Cl.
*H03F 1/56* (2006.01)
*H03F 1/02* (2006.01)
*H03F 3/195* (2006.01)
*H03F 3/68* (2006.01)
*H03F 3/21* (2006.01)

(52) U.S. Cl.
CPC ......... *H03F 1/565* (2013.01); *H03F 1/0288* (2013.01); *H03F 3/195* (2013.01); *H03F 3/21* (2013.01); *H03F 3/68* (2013.01); *H01L 2224/49175* (2013.01); *H03F 2200/222* (2013.01); *H03F 2200/387* (2013.01); *H03F 2200/423* (2013.01); *H03F 2200/451* (2013.01)

(58) Field of Classification Search
USPC ......................... 330/295, 124 R, 286, 53–54
See application file for complete search history.

(56) References Cited

U.S. PATENT DOCUMENTS 7,961,048 B2 * 6/2011 Oakley ................ H03F 1/0288
330/124 R
8,659,359 B2 * 2/2014 Ladhani ............... H03F 1/0288
330/302

* cited by examiner

*Primary Examiner* — Hieu P Nguyen
(74) *Attorney, Agent, or Firm* — Sherry W. Schumm

(57) ABSTRACT

Apparatus are provided for amplifier systems and related circuits are provided. An exemplary circuit includes a main amplifier arrangement, first impedance matching circuitry coupled between the output of the main amplifier arrangement and a first circuit output, a peaking amplifier arrangement, and second impedance matching circuitry coupled between the output of the peaking amplifier arrangement and a second output of the circuit. In one exemplary embodiment, the first impedance matching circuitry and the second impedance matching circuitry have different circuit topologies and different physical topologies.

19 Claims, 3 Drawing Sheets

AMPLIFIERS AND RELATED INTEGRATED CIRCUITS

RELATED APPLICATION

This application is a continuation of co-pending, U.S. patent application Ser. No. 15/945,669, filed on Apr. 4, 2018, which is a continuation of U.S. patent application Ser. No. 15/237,015, filed on Aug. 15, 2016, and issued as U.S. Pat. No. 9,941,845, which is a continuation of U.S. patent application Ser. No. 14/009,099, filed on Jul. 16, 2014, and issued as U.S. Pat. No. 9,419,566, which is a 371 of international application number PCT/IB2011/001049, filed on Apr. 20, 2011.

TECHNICAL FIELD

Embodiments of the subject matter described herein relate generally to electronic circuits, and more particularly, embodiments of the subject matter relate to amplifiers and related amplifier circuit topologies.

BACKGROUND

Amplifiers are commonly used to amplify a signal. For example, in radio frequency (RF) or cellular applications, base stations or other infrastructure components employ amplifiers to broadcast signals over greater distances. For communication schemes having relatively high peak-to-average ratios, Doherty amplifier topologies are commonly used to improve efficiency. A Doherty amplifier topology typically includes a pair of amplifiers, a main (or carrier) amplifier and a peaking (or auxiliary) amplifier. The peaking amplifier is biased to turn on when the input signal increases above a level that would cause the main amplifier to saturate, thereby reducing the impedance at the output of the main amplifier to enable the main amplifier to deliver more current in conjunction with current delivered by the peaking amplifier.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein relate to amplifiers and impedance matching circuitry suitable for use in Doherty amplifier topologies that are capable of achieving relatively high gain and relatively high efficiency relative to conventional Doherty amplifier topologies. As described in greater detail below, in an exemplary embodiment, the output impedance matching circuitry for the peaking amplifier has a circuit topology and a physical topology that is different from the output impedance matching circuitry of the main amplifier. As a result, when the amplifiers and their associated output impedance matching circuitry are implemented in a single device package or integrated circuit, the inductive coupling between the outputs of the amplifiers may be reduced by virtue of the differences in the phase relationships between the output signals from the output impedance matching circuitry in conjunction with the physical differences of the output impedance matching circuitry. As used herein, a circuit topology should be understood as referring to an interconnection of electrical components, wherein two circuit topologies are different if the electrical components are interconnected in a different manner or interchanged for different electrical components, while a physical topology should be understood as referring to the physical structure or shape of the electrical circuit, wherein two physical topologies are different if there is any deviation among their physical shapes in any dimension.

Figure 1:
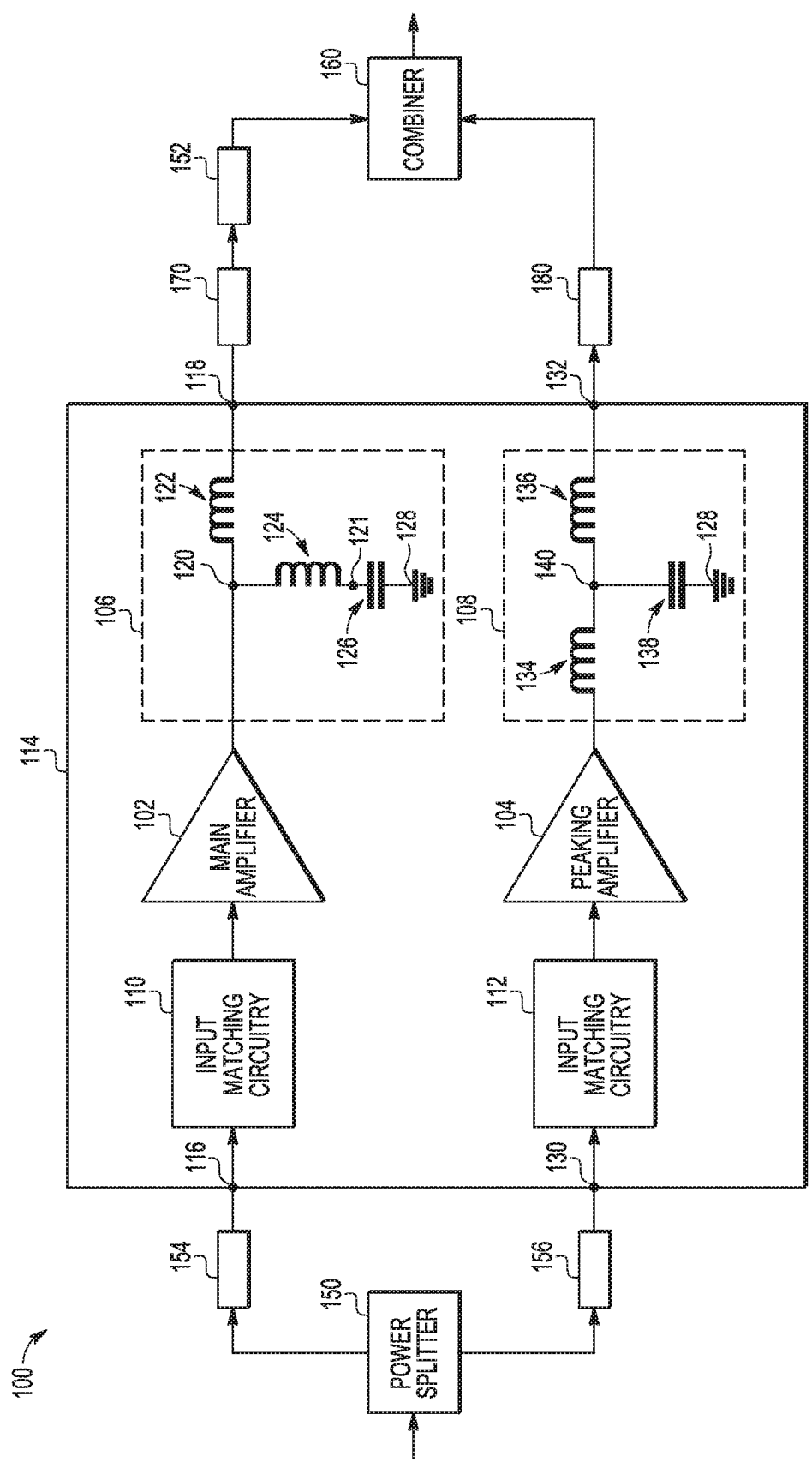
FIG. 1 is a block diagram of an amplifier system in accordance with one embodiment of the invention.

FIG. 1 depicts an exemplary embodiment of an amplifier system 100 including, without limitation, a first amplifier arrangement 102, a second amplifier arrangement 104, first output impedance matching circuitry 106 coupled to the output of the first amplifier arrangement 102, second output impedance matching circuitry 108 coupled to the output of the second amplifier arrangement 104, first input impedance matching circuitry 110 coupled to the input of the first amplifier arrangement 102, and second input impedance matching circuitry 112 coupled to the input of the second amplifier arrangement 104. In an exemplary embodiment, the amplifier system 100 is configured as a Doherty amplifier, wherein the second amplifier arrangement 104 is biased such that the second amplifier arrangement 104 functions as the peaking (or auxiliary) amplifier, which provides power when the amplitude of the signal at the input to the second amplifier arrangement 104 is above a threshold and otherwise is turned off when the amplitude of the signal at the input to the second amplifier arrangement 104 is below the threshold, while the first amplifier arrangement 102 is biased such that the first amplifier arrangement 102 is always on and functions as the main (or carrier) amplifier. Accordingly, for convenience, but without limitation, the first amplifier arrangement 102 is alternatively referred to herein as the main amplifier and the second amplifier arrangement 104 is alternatively referred to herein as the peaking amplifier. In the illustrated embodiment, the main amplifier 102, the peaking amplifier 104, the output impedance matching circuitry 106, 108, and the input impedance matching circuitry 110, 112 are packaged into a single device package or integrated circuit 114, as described in greater detail below.

In an exemplary embodiment, the main amplifier 102 is realized as one or more transistors configured as a Class AB amplifier, that is, one or more transistors are biased to provide a conduction angle between 180 and 360 degrees. The first input impedance matching circuitry 110 is coupled between the input of the main amplifier 102 and a first input 116 of the integrated circuit 114 and configured to provide a desired input impedance at the first input 116 at the fundamental frequency (or carrier frequency) of the amplifier system 100, and the first output impedance matching circuitry 106 is coupled between the output of the main amplifier 102 and a first output node 118 of the integrated circuit 114 and configured to provide a desired output impedance at the output 118 of the integrated circuit 114 at the fundamental frequency of the amplifier system 100. In an exemplary embodiment, the amplifier system 100 is used to transmit radio frequency signals, wherein the fundamental frequency (or carrier frequency) is the frequency of transmittance.

In an exemplary embodiment, the peaking amplifier 104 is realized as one or more transistors configured as a Class C amplifier, that is, one or more transistors biased to provide a conduction angle less than 180 degrees. The peaking amplifier 104 is biased to turn on when the main amplifier 102 is saturated, that is, when the input signal (or input voltage) to the peaking amplifier 104 exceeds a threshold signal level (or voltage) indicative of the main amplifier 102 being at or near saturation. The second input impedance matching circuitry 112 is coupled between the input of the peaking amplifier 104 and a second input 130 of the integrated circuit 114 and configured to provide a desired input impedance at the second input 130 at the fundamental frequency of the amplifier system 100, and the second output impedance matching circuitry 108 is coupled between the output of the peaking amplifier 104 and a second output node 132 of the integrated circuit 114 and configured to provide a desired output impedance at the output 132 of the integrated circuit 114 at the fundamental frequency of the amplifier system 100.

In an exemplary embodiment, the main amplifier output impedance matching circuitry 106 is realized as a high-pass impedance matching circuit topology. For example, in the illustrated embodiment of FIG. 1, the main amplifier output impedance matching circuitry 106 is realized as a shunt inductance impedance matching circuit topology that includes a first inductive element 122 configured electrically in series between the output of the main amplifier 102 at node 120 and the output 118 of the integrated circuit 114, a second inductive element 124 connected between the output of the main amplifier 102 at node 120 and a reference voltage node 121, and a capacitive element 126 connected between the second inductive element 124 at the reference voltage node 121 and a node 128 configured to receive a ground reference voltage for the amplifier system 100. As illustrated, the second inductive element 124 and the capacitive element 126 are configured electrically in series between the output of the main amplifier 102 at node 120 and the ground reference voltage node 128. In an exemplary embodiment, the main amplifier output impedance matching circuitry 106 provides a single phase inversion (e.g., a 90° phase shift) that results in the phase of the signal at the output 118 being shifted 90° relative to the signal at the output of the main amplifier 102 at node 120.

In an exemplary embodiment, the capacitance of the capacitive element 126 is chosen to provide a virtual ground reference voltage for the radio frequency (RF) electrical signals at the output of the main amplifier 102 at the reference voltage node 121, such that the second inductive element 124 functions as a shunt inductance to the RF ground voltage, while the inductances of the inductive elements 122, 124 are chosen to provide desired impedance at the output 118 of the integrated circuit 114 at the fundamental frequency of the amplifier system 100. For example, for a fundamental frequency in the range of about 1.8 GHz to about 2.2 GHz with a main amplifier 102 with a power handling capability within the range of about 50 W to about 500 W, the capacitance of the capacitive element 126 may be chosen to be within the range of about 70 pF to about 500 pF, the impedance of the inductive element 122 may be chosen to be within the range of about 100 pH to about 800 pH and the inductance of the inductive element 124 may be chosen to be within the range of about 100 pH to about 500 pH, such that the main amplifier output impedance matching circuitry 106 provides an output impedance at the output 118 of the integrated circuit 114 within the range of about one to five ohms. It should be appreciated that the desired output impedance at the output 118 may be an intermediate impedance that is subsequently transformed to a different value for impedance matching at the input of a power combiner 160, and thus, the output impedance at the output 118 will vary to suit the needs of a particular implementation.

In an exemplary embodiment, peaking amplifier output impedance matching circuitry 108 is realized as a low-pass impedance matching circuit topology. For example, in the illustrated embodiment of FIG. 1, the peaking amplifier output impedance matching circuitry 108 is realized as a shunt capacitance impedance matching circuit topology that includes a first inductive element 134 connected electrically in series between the output of the peaking amplifier 104 and a node 140, a second inductive element 134 connected electrically in series between node 140 and the output 132 of the integrated circuit 114, and a capacitive element 138 connected between node 140 and the ground reference voltage node 128. The illustrated embodiment of the peaking amplifier output impedance matching circuitry 108 provides a double phase inversion (e.g., 180° phase shift) that results in the phase of the signal at the output 132 being shifted 180° relative to the signal at the output of the peaking amplifier 104.

As set forth above, the capacitance of the capacitive element 138 and the inductances of the inductive elements 134, 136 are chosen to provide a desired output impedance at the output 132 of the integrated circuit 114 at the fundamental frequency of the amplifier system 100. For example, for a fundamental frequency of about 1.8 GHz to about 2.2 GHz with a peaking amplifier 104 with a power handling capability within the range of about 50 W to about 500 W, the capacitance of the capacitive element 138 may be chosen to be within the range of about 15 pF to about 150 pF, the inductance of the inductive element 134 may be chosen to be within the range of about 100 pH to about 400 pH, and the inductance of inductive element 136 may be chosen to be within the range of about 50 pH to about 150 pH, such that the peaking amplifier output impedance matching circuitry 108 provides an output impedance at the output 132 of the integrated circuit 114 within the range of about one to five ohms. As noted above, in practice, the output impedance at the output 132 may vary to suit the needs of a particular embodiment.

In the illustrated embodiment, the inputs 116, 130, and outputs 118, 132 generally represent the package leads, pins, or other physical interfaces for creating electrical connections to the internal components (e.g., amplifiers 102, 104) of the integrated circuit 114. In a similar manner as set forth above in regards to the output impedance matching circuitry 106, 108, the main amplifier input impedance matching circuitry 110 is configured to provide a desired input impedance at the input 116 of the integrated circuit 114 at the fundamental frequency of the amplifier system 100, and the peaking amplifier input impedance matching circuitry 112 is configured to provide a desired input impedance at the input 130 of the integrated circuit 114 at the fundamental frequency of the amplifier system 100. For example, for a fundamental frequency of about 1.8 GHz to about 2.2 GHz, the main amplifier input impedance matching circuitry 110 provides an input impedance at the input 116 of the integrated circuit 114 within the range of about one to five ohms, and the peaking amplifier input impedance matching circuitry 112 provides an input impedance at the input 130 of the integrated circuit 114 within the range of about one to five ohms; however, as set forth above, in practice, the input impedance at the inputs 116, 130 may vary to suit the needs of a particular embodiment. In accordance with one embodiment, the main amplifier input impedance matching circuitry 110 and the peaking amplifier input impedance matching circuitry 112 are each realized as a low-pass impedance matching circuit topology, such as a shunt capacitance impedance matching circuit topology configured in a similar manner as set forth above in regards to the peaking amplifier output impedance matching circuitry 108. However, it should be noted that the subject matter described herein is not intended to be limited to any particular configuration and/or circuit topology for the input impedance matching circuitry 110, 112, and in some embodiments, the main amplifier input impedance matching circuitry 110 and the peaking amplifier input impedance matching circuitry 112 may be different, and the main amplifier input impedance matching circuitry 110 and/or the peaking amplifier input impedance matching circuitry 112 may be realized as a high-pass impedance matching circuit topology.

In the illustrated embodiment of FIG. 1, the amplifier system 100 is configured for a Doherty amplifier implementation. In this regard, the amplifier system 100 includes a power splitter (or power divider) 150 configured to divide the input power of the input signal to be amplified among the main amplifier 102 and the peaking amplifier 104, and each input 116, 130 is coupled to a respective output of the power splitter 150 to receive a portion of the input signal to be amplified by the amplifier system 100. For example, a first output of the power splitter 150 may be coupled to the input 116 corresponding to the main amplifier 102 and a second output of the power splitter 150 may be coupled to the input 130 corresponding to the peaking amplifier 104, and the power splitter 150 may divide the input power equally among the amplifiers 102, 104, such that roughly fifty percent of the input signal power is provided to the main amplifier 102 at input 116 and fifty percent of the input signal power is provided to the peaking amplifier 104 at input 130. As described above, in an exemplary embodiment, the peaking amplifier 104 is biased for Class C operation, such that the peaking amplifier 104 is turned off when the input signal power (or voltage) at the input 130 is less than a threshold amount that indicates that the main amplifier 102 is at or near saturation.

In an exemplary embodiment, each output 118, 132 of the integrated circuit 114 is coupled to a respective input to a power combiner 160 that combines the amplified output signals at the outputs 118, 132 to produce an amplified version of the input signal provided to the power splitter 150. In the illustrated embodiment, an impedance transforming element 152, such as an impedance transformer or a transmission line, is coupled between the output 118 of the integrated circuit 114 and an input of the power combiner 160 such that the effective impedance of the output of the peaking amplifier 104 seen by the power combiner 160 (e.g., the effective input impedance at output 132) is represents an open circuit (e.g., effectively infinite impedance) when the peaking amplifier 104 is turned off. To compensate for the impedance transforming element 152, impedance matching elements 156 that include a include a quarter wave transformer (e.g., a 90° phase length transmission line) are coupled between the output of the power splitter 150 corresponding to the peaking amplifier 104 and the input 130 to the peaking amplifier 104, such that there is a 90° phase difference between the portion of the input signal provided to the input 130 of the peaking amplifier 104 relative to the portion of the input signal provided to the input 116 of the main amplifier 102. In addition to the impedance matching elements 154, 156, in an exemplary embodiment, impedance matching elements 170, 180 are coupled to the outputs 118, 132 of the integrated circuit 114 to match the impedances at the inputs to the power combiner 160. In this regard, the main amplifier output impedance matching circuitry 106, impedance matching element 170, and impedance transforming element 152 are configured to provide an impedance at the input of the power combiner 160 corresponding to the main amplifier 102 that is substantially equal to the impedance at the input of the power combiner 160 corresponding to the peaking amplifier 104 that is provided by the peaking amplifier output impedance matching circuitry 108 and the impedance matching element 180. Although not illustrated in FIG. 1, in practical embodiments, an additional quarter wave impedance transformer may be implemented by the power combiner 160 or otherwise follow the output of the power combiner 160.

It should be noted that the quarter wave impedance transforming element included in the impedance matching element 156 combined with the double phase inversion provided by the peaking amplifier output impedance matching circuitry 108 results in the signals at the second output 132 of the integrated circuit 114 being 180° out of phase relative to the signals at the first output 118 of the integrated circuit 114, thereby reducing the coupling between the signals at the outputs 118, 132 of the integrated circuit 114.

It should be understood that FIG. 1 is a simplified representation of an amplifier system 100 for purposes of explanation and ease of description, and that practical embodiments may include other devices and components to provide additional functions and features, and/or the amplifier system 100 may be part of a much larger electrical system, as will be understood. Thus, although FIG. 1 depicts direct electrical connections between circuit elements and/or terminals, alternative embodiments may employ intervening circuit elements and/or components while functioning in a substantially similar manner.

Figure 2:
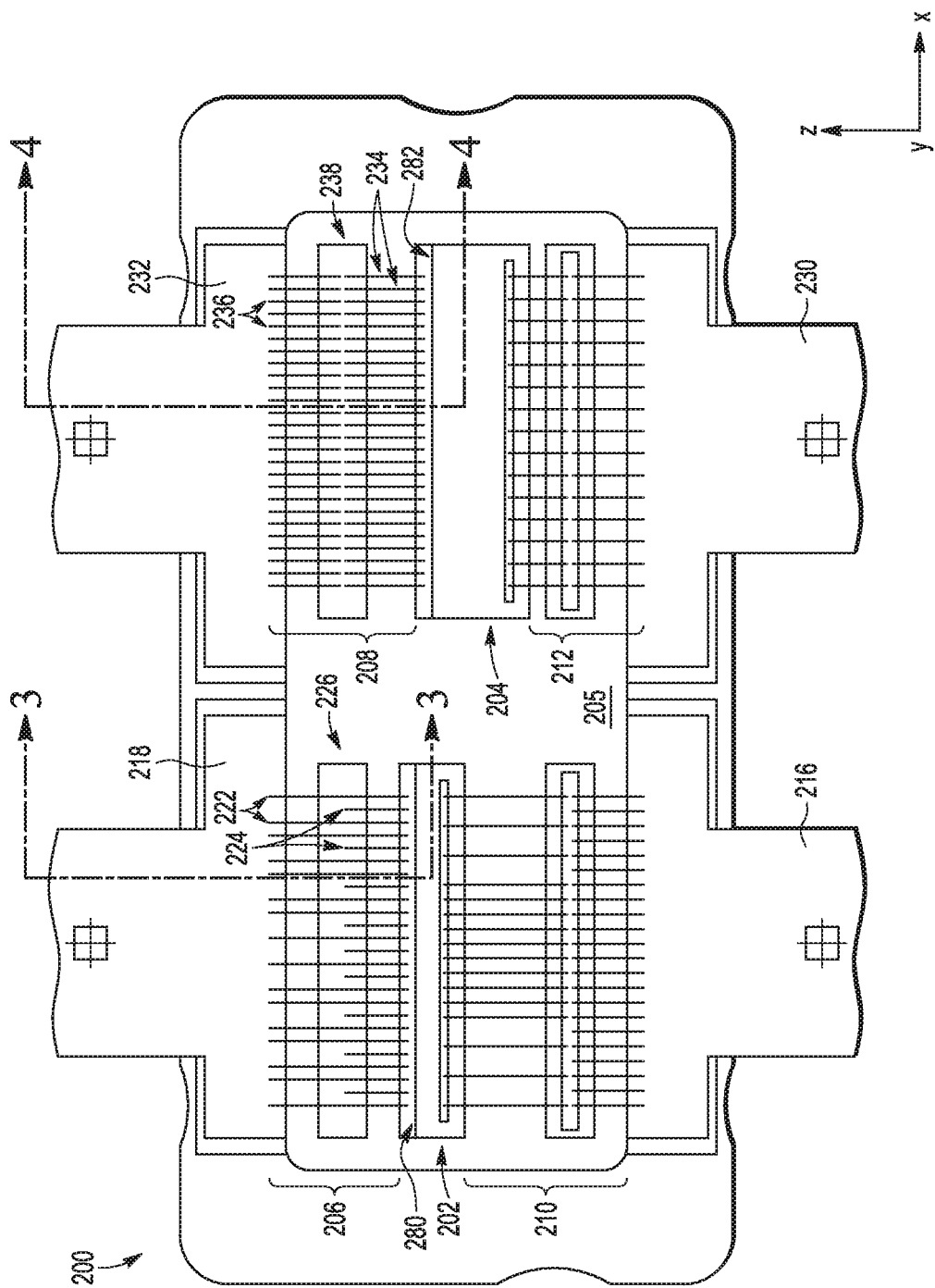
FIGS. 2-4 are top and partial cross-sectional views of an integrated circuit suitable for use in the amplifier system of FIG. 1 in accordance with one embodiment of the invention.
Figure 4:
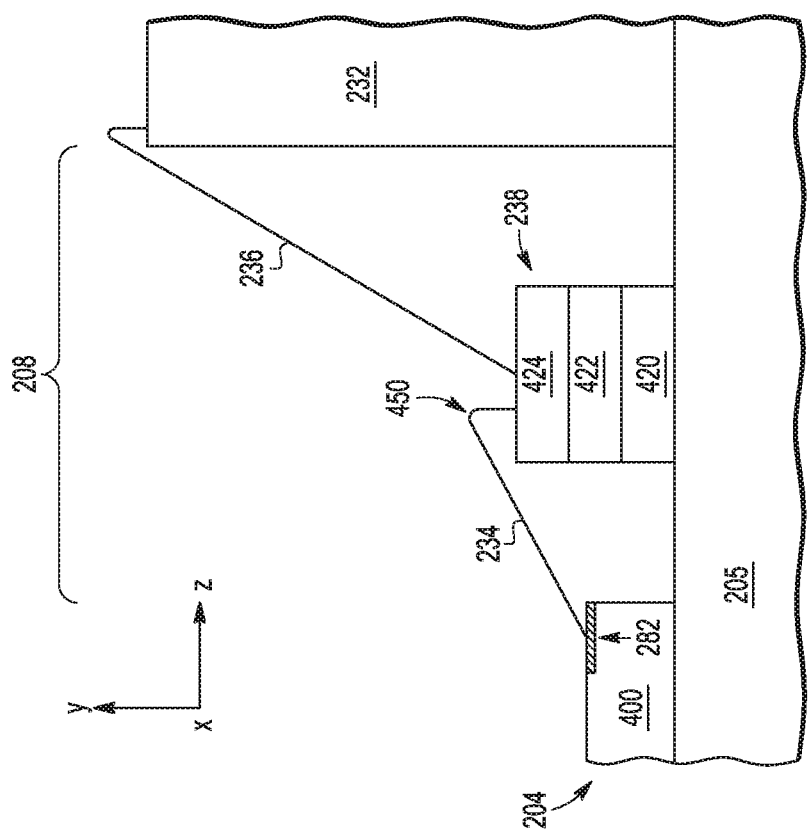
Figure 3:
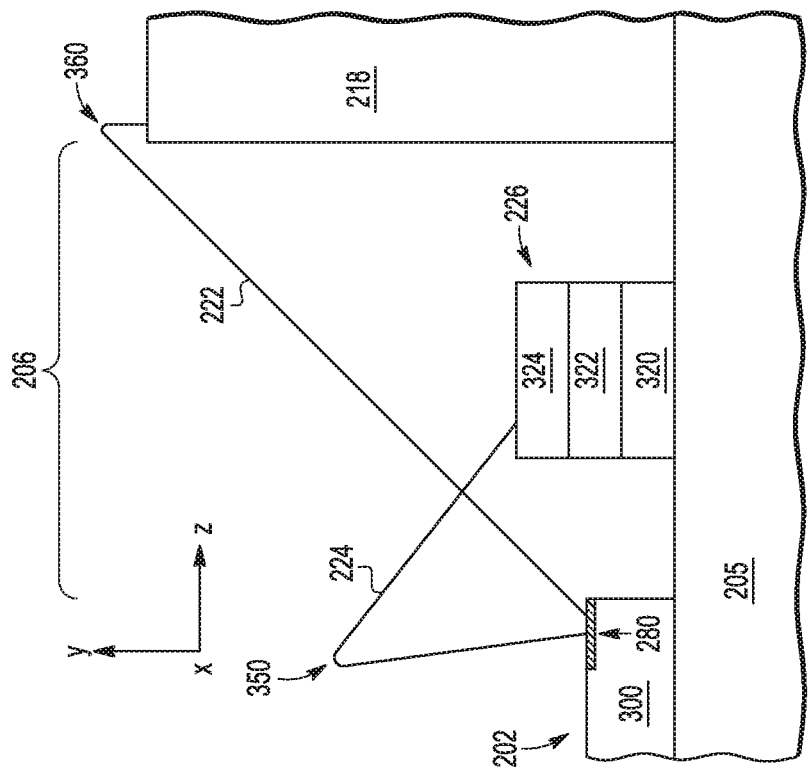

FIGS. 2-4 depict top and partial cross-sectional views of an exemplary embodiment of an integrated circuit 200 suitable for use as the integrated circuit 114 in the amplifier system 100 of FIG. 1. As described above, the integrated circuit 200 includes a main amplifier 202, a peaking amplifier 204, main amplifier output impedance matching circuitry 206 coupled between the main amplifier 202 and its associated output package lead 218, peaking amplifier output impedance matching circuitry 208 coupled between the peaking amplifier 204 and its associated output package lead 232, main amplifier input impedance matching circuitry 210 coupled between the main amplifier 202 and its associated input package lead 216, and peaking amplifier input impedance matching circuitry 212 coupled between the peaking amplifier 204 and its associated input package lead 230. The elements of the integrated circuit 200 are similar to their counterpart elements described above in the context of FIG. 1, and accordingly, such common aspects will not be redundantly described here in the context of FIGS. 2-4.

Referring now to FIGS. 2-3, the main amplifier 202 is preferably realized as one or more transistors formed on a semiconductor substrate (or die) 300 that is formed on or otherwise mounted or affixed to a metal substrate 205 (e.g., copper or the like) that provides an electrical ground reference voltage (e.g., ground reference voltage node 128) for the integrated circuit 200. In this regard, the metal substrate 205 functions as the primary mounting structure for an integrated circuit 200, such that other components of the integrated circuit 200 (e.g., the input impedance matching circuitry 210, 212, the peaking amplifier 204, the peaking amplifier output impedance matching circuitry 208, and the like) are formed on or otherwise mounted or affixed to surrounding areas of the metal substrate 205, as described in greater detail below. As described above, in an exemplary embodiment, the one or more transistors formed on the semiconductor substrate 300 are configured such that the main amplifier 202 operates in the Class AB mode. In this regard, the amplified output signal generated by the main amplifier 202 is present at a terminal (e.g., the drain terminal) of the one or more transistors formed on the semiconductor substrate 300, and the transistor die 300 includes a conductive contact region 280 formed thereon for connecting to that terminal of the transistor(s) where the amplified output signal is present (e.g., the output of the main amplifier 202).

As described above, the main amplifier output impedance matching circuitry 206 includes a first inductive element 222 (e.g., inductive element 122) coupled between the main amplifier 202 and an output package lead 218 corresponding to the main amplifier 202 (e.g., output 118), a capacitive element 226 (e.g., capacitive element 126) formed on the metal substrate 205, and a second inductive element 224 (e.g., inductive element 124) coupled between the main amplifier 202 and the capacitive element 226. In the illustrated embodiment of FIG. 3, the capacitive element 226 is realized as a metal-oxide-semiconductor (MOS) capacitor that includes a conductive layer 320, such as a layer of a doped silicon material, formed on the metal substrate 205, a layer of a dielectric material 322, such as an oxide material, formed overlying the conductive layer 320, and another conductive layer 324, such as layer of a metal material, formed overlying the layer of dielectric material 322. The thickness and/or dielectric constant of the dielectric material 322 may be chosen to provide a capacitance for the capacitive element 226, such that the voltage of the metal layer 324 corresponds to a RF ground voltage, as described above in the context of capacitive element 126. It should be appreciated that the capacitive element 226 is not intended to be limited to a MOS capacitor structure, and in practice, the capacitive element 226 may be realized using another suitable capacitor structure.

In an exemplary embodiment, the first inductive element 222 is realized one or more conductive wires (or bondwires), with each wire 222 having a first end that is soldered, bonded, affixed, or otherwise electrically connected to the contact region 280 and an opposing end that is soldered, bonded, affixed, or otherwise electrically connected to the output package lead 218. Similarly, the second inductive element 224 is realized as a conductive wire having a first end that is soldered, bonded, affixed, or otherwise electrically connected to the contact region 280 on the die 300 and an opposing end that is soldered, bonded, affixed, or otherwise electrically connected to the metal layer 324 of the capacitive element 226. The number and/or lengths of the wires of the first inductive element 222 is chosen to provide a desired inductance for the first inductive element 222 (e.g., inductive element 122) and the number and/or lengths of the wires of the second inductive element 224 is chosen to provide a desired inductance for the second inductive element 224 (e.g., inductive element 124), to thereby provide a desired impedance at the output package lead 218 (e.g., output 118), as described above.

As illustrated in FIG. 2, the lengths of the wires 222, 224 are aligned substantially parallel to one another in the z-direction extending from main amplifier 202 (or die 300) to output package lead 218 with minimal deviation in the x-direction, however, as illustrated in FIG. 3, the cross-sections or profiles of the trajectories of the wires 222, 224 in the yz-reference plane are different. In this regard, the length of the wires 224 extend from the contact region 280 and/or die 300 primarily in the y-direction (e.g., a vertical direction or normal direction relative to the substrate 205) to an apex point 350 above the die 300 before extending downward in the y-direction and laterally in the z-direction to the capacitive element 226. Conversely, the wires 222 extend from the contact region 280 and/or die 300 primarily in the z-direction (e.g., a horizontal or lateral direction) with minimal increase in the y-direction to an apex point 360 above the lead 218, such that the apex point 360 of the wires 222 of the first inductive element is distal to the apex point 350 of the wires 224 of the second inductive element in the z-direction. As illustrated, the wires 224 of the second inductive element have a more vertical trajectory from die 300 to capacitive element 226 in the yz-reference plane that is oblique to the trajectory of the wires 222 in the yz-reference plane (e.g., a more horizontal trajectory from die 300 to lead 218) as the wires 222, 224 traverse in the z-direction. The trajectories of the wires 222, 224 dictate the physical direction of current flow through the wires 222, 224 in the yz-reference plane, and thus, by virtue of the different trajectories over the distance from the die 300 to the capacitive element 226 increasing the angle between the wires 222, 224 in the yz-reference plane, the coupling between the wires 222, 224 caused by current flow through the wires 222, 224 is reduced.

Referring now to FIGS. 2 and 4, the peaking amplifier 204 is preferably realized as one or more transistors formed on a semiconductor substrate (or die) 400 that is formed on or otherwise mounted or affixed to the metal substrate 205. As described above in the context of FIG. 1, in an exemplary embodiment, the one or more transistors formed on the semiconductor substrate 400 are configured such that the peaking amplifier 204 operates in the Class C mode. As set forth above, the amplified output signal generated by the peaking amplifier 204 is present at a terminal (e.g., the drain terminal) of the transistor(s) formed on the semiconductor substrate 400, and the transistor die 400 includes a conductive contact region 282 formed thereon for connecting to that terminal of the transistor(s) where the amplified output signal is present (e.g., the output of the peaking amplifier 204).

As described above, the peaking amplifier output impedance matching circuitry 208 includes an inductive element 234 (e.g., inductive element 134) coupled between the peaking amplifier 204 and a capacitive element 238 (e.g., capacitive element 138) formed on the metal substrate 205, and an inductive element 236 (e.g., inductive element 136) coupled between the capacitive element 238 and an output package lead 232 corresponding to the peaking amplifier 204 (e.g., output 132). In the illustrated embodiment of FIG. 4, the capacitive element 238 is realized as a MOS capacitor that includes a layer of doped silicon material 420 formed on the metal substrate 205, a layer of a dielectric material 422 formed overlying the layer of silicon material 420, and a layer of a metal material 424 formed overlying the layer of dielectric material 422. As set forth above, the capacitive element 238 is not intended to be limited to a MOS capacitor structure, and in practice, the capacitive element 238 may be realized using another suitable capacitor structure.

In an exemplary embodiment, inductive element 234 is realized as one or more conductive wires, with each wire 234 having a first end that is soldered, bonded, affixed, or otherwise electrically connected to the contact region 282 for the output of the peaking amplifier 204, and an opposing end that is soldered, bonded, affixed, or otherwise electrically connected to the metal layer 424 of the capacitive element 238. Similarly, inductive element 236 is realized as one or more conductive wires, with each wire 236 having a first end that is soldered, bonded, affixed, or otherwise electrically connected to the metal layer 424 of the capacitive element 238 and an opposing end that is soldered, bonded, affixed, or otherwise electrically connected to the output package lead 232 corresponding to the peaking amplifier 204. The numbers and/or lengths of the wires 234, 236 are chosen to provide desired inductances for the inductive elements 234, 236 (e.g., inductive elements 134, 136) and the thickness and/or dielectric constant of the dielectric material 422 are chosen to provide a desired capacitance for the capacitive element 238 (e.g., capacitive element 138), to thereby provide a desired impedance at the output package lead 232 (e.g., output 132), as described above. It should be noted that although FIGS. 2 and 4 depict the inductive elements 234, 236 as separate wires, in some practical embodiments, the inductive elements 234, 236 may be realized as a single conductive wire having its ends bonded to the contact region 282 and the output package lead 232 with an interior location along the length of the wire that is stitch bonded to capacitive element 238 to provide a geometric shape and/or profile similar to that of the inductive elements 234, 236 illustrated in FIG. 4 using a single conductive wire.

As illustrated in FIG. 2, the lengths of the wires 234, 236 extending from peaking amplifier 204 (or die 400) to output package lead 232 are aligned substantially parallel to the z-direction, and thus, are substantially parallel to the lengths of the wires 222, 224 of the main amplifier output impedance matching circuitry 206 in the z-direction. However, as illustrated in FIG. 4, the cross-sections or profiles of the trajectories of the wires 234, 236 in the yz-reference plane are different from those of wires 222, 224. In this regard, the length of the wires 234 extends from contact region 282 and/or die 400 primarily in the z-direction (e.g., horizontally or laterally) with minimal increase in the y-direction (e.g., minimal increase in the distance between the wires 234 and the substrate 205) to an apex point 450 above the capacitive element 238 before extending primarily downward in the y-direction to the capacitive element 238. In this manner, the apex point 450 of the wires 234 is distal to the apex point 350 of the wires 224 in the z-direction, and the wires 234 have a more horizontal trajectory that is oblique to the more vertical trajectory of wires 224 in the yz-reference plane as the wires 224, 234 traverse in the z-direction, thereby reducing the coupling between wires 224 and wires 234 by increasing the angle between the wires 224, 234 in the yz-reference plane. As illustrated, the trajectory of wires 236 is oblique to the trajectory of wires 222 in the yz-reference plane, thereby reducing the coupling between wires 222, 236.

Referring now to FIGS. 3-4, and with continued reference to FIGS. 1-2, by virtue of the differences in the physical topology of the peaking amplifier output impedance matching circuitry 208 relative to the physical topology of the main amplifier output impedance matching circuitry 206, the coupling between the peaking amplifier output impedance matching circuitry 208 and the main amplifier output impedance matching circuitry 206 is reduced. As a result, the distance between the peaking amplifier output impedance matching circuitry 208 and the main amplifier output impedance matching circuitry 206 to be reduced when packaged in a single integrated circuit 114, 200 (or device package), as described in greater detail below.

Referring again to FIGS. 1-2, as described above in the context of FIG. 1, in an exemplary embodiment, the main amplifier input impedance matching circuitry 110, 210 and the peaking amplifier input impedance matching circuitry 112, 212 are each realized as a low-pass impedance matching circuit topology. As illustrated in FIG. 2, the main amplifier input impedance matching circuitry 210 and the peaking amplifier input impedance matching circuitry 212 are each realized as a shunt capacitance impedance matching circuit topology configured between input package leads 216, 230 and amplifiers 202, 204 and/or transistor dies 300, 400 in a similar manner as set forth above in regards to the peaking amplifier output impedance matching circuitry 208. However, it should be noted that the subject matter described herein is not intended to be limited to any particular configuration and/or circuit topology for the input impedance matching circuitry 210, 212, and in some embodiments, the main amplifier input impedance matching circuitry 210 and the peaking amplifier input impedance matching circuitry 212 may be different, and the main amplifier input impedance matching circuitry 210 and/or the peaking amplifier input impedance matching circuitry 212 may be realized as a high-pass impedance matching circuit topology.

Referring now to FIGS. 1-4, in an exemplary embodiment, the die 300 for the main amplifier 102, 202 and the die 400 for the peaking amplifier 104, 204 are mounted or otherwise affixed to the same substrate 205 with the lengths of the wires 222, 224 used for the inductive elements 122, 124 of the main amplifier output impedance matching circuitry 206 aligned substantially parallel to the lengths of the wires 234, 236 used for the inductive elements 134, 136 of the peaking amplifier output impedance matching circuitry 108, 208. By virtue of the different physical topologies of the peaking amplifier output impedance matching circuitry 108, 208 and the main amplifier output impedance matching circuitry 106, 206 (e.g., the different trajectories of wires 222, 224, 236, 238 in the yz-reference plane), along with the phase difference between the amplified output signals from the main amplifier 102, 202 at its output package lead 118, 218 and the amplified output signals from the peaking amplifier 104, 204 at its output package lead 132, 232, the spacing (i.e., the distance in the x-direction) between the main amplifier 102, 202 (or die 300) and the peaking amplifier 104, 204 (or die 400) and/or the spacing between the main amplifier output impedance matching circuitry 106, 206 and the peaking amplifier output impedance matching circuitry 108, 208 may be reduced when implemented inside the same device package 114, 200. In this manner, the overall form factor and/or area footprint for the integrated circuit 114, 200 may be reduced relative to traditional Doherty systems where the main amplifier and the peaking amplifier are spaced apart by greater distances (e.g., due to crosstalk, inductive coupling, and/or other circuit level effects).

Additionally, as illustrated in FIG. 2, in an exemplary embodiment, the transistor(s) (or die 300) for the main amplifier 102, 202 may be sized independently from the transistor(s) for the peaking amplifier 104, 204 to accommodate different power ratios between the main amplifier 102, 202 and the peaking amplifier 104, 204. For example, as illustrated, the size and/or device width of the transistor(s) and/or die 400 for the peaking amplifier 104, 204 (e.g., the source to drain pitch, the gate width, and the like) may be greater than the size and/or device width of the transistor(s) and/or die 300 for the main amplifier 102, 202 to accommodate for additional periphery and/or power density of the peaking amplifier 104, 204 due to its operating in the Class C mode while still being packaged within the same device package 114, 200 as the main amplifier 102, 202. In this regard, the ratio of the power handling capability of the peaking amplifier 104, 204 relative to the power handling capability of the main amplifier 102, 202 may be greater than one for asymmetric Doherty operation. In various embodiments, specific parameters for the peaking amplifier die 400, such as source-to-drain pitch, doping levels, the type of semiconductor material used for die 400, and the like, may be modified independently of the main amplifier die 300 to improve operation of the Class C operation of the peaking amplifier 104, 204. In this regard, the peaking amplifier 104, 204 may be fabricated using a different technology than the main amplifier 102, 202, for example, the peaking amplifier 104, 204 may be realized using gallium nitride transistor technology while the main amplifier 102, 202 may be realized using silicon-based transistor technology. Another advantage of the amplifier system 100 described herein is that the overall gain of the Doherty amplifier is increased because the combination of a low-pass impedance matching circuit topology for the peaking amplifier output impedance matching circuitry 108, 208 and a high-pass impedance matching circuit topology for the main amplifier output impedance matching circuitry 106, 206 reduces the difference between the amplitude of the amplified output signals at main amplifier output lead 118, 218 and the amplitude of the amplified output signals at the peaking amplifier output lead 132, 232. Additionally, the capacitance of the capacitive element 138, 238 in the peaking amplifier input impedance matching circuitry 112, 212 may be varied relative to the capacitance of the capacitive element 126, 226 in the main amplifier input impedance matching circuitry 110, 210 to increase the gain of the peaking amplifier 104, 204 relative to the main amplifier 102, 202.

For the sake of brevity, conventional techniques related to Doherty amplifiers, load modulation, impedance matching, integrated circuit design and/or fabrication, transistor design and/or fabrication, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

In conclusion, systems, devices, and methods configured in accordance with example embodiments of the invention relate to:

An apparatus for an integrated circuit is provided. The integrated circuit includes a first amplifier arrangement having a first amplifier output, first impedance matching circuitry coupled between the first amplifier output and a first output of the integrated circuit, a second amplifier arrangement having a second amplifier output, and second impedance matching circuitry coupled between the second amplifier output and a second output of the integrated circuit, wherein a topology of the second impedance matching circuitry and a topology of the first impedance matching circuitry are different. In one embodiment, the first impedance matching circuitry is a high-pass impedance matching circuit topology and the second impedance matching circuitry is a low-pass impedance matching circuit topology. In a further embodiment, the first amplifier arrangement is configured to operate in Class AB mode and the second amplifier arrangement is configured to operate in Class C mode. In another embodiment, a phase inversion provided by the first impedance matching circuitry and a phase inversion provided by the second impedance matching circuitry are different. In one embodiment, the first impedance matching circuitry provides a single phase inversion and the second impedance matching circuitry provides a double phase inversion. In another embodiment, a physical topology of the second impedance matching circuitry and a physical topology of the first impedance matching circuitry are different. In accordance with one or more embodiments, the first impedance matching circuitry includes a first inductive element coupled between a first node and the first output, the first node being coupled to the first amplifier output, a second inductive element coupled to the first node, and a first capacitive element coupled between the second inductive element and a ground reference voltage node, such that the second inductive element and the first capacitive element are configured electrically in series between the first node and the ground reference voltage node. The second impedance matching circuitry includes a third inductive element coupled between the second amplifier output and a second node, a fourth inductive element coupled between the second node and the second output, and a second capacitive element coupled between the second node and the ground reference voltage node. In a further embodiment, the first amplifier arrangement includes a first transistor configured to operate in Class AB mode and the second amplifier arrangement includes a second transistor configured to operate in Class C mode. In one embodiment, the first inductive element is realized as a first wire connected between the first amplifier arrangement and the first output, the second inductive element is realized as a second wire connected between the first amplifier arrangement and the first capacitive element, the third inductive element is realized as a third wire connected between the second amplifier arrangement and the second capacitive element, and the fourth inductive element is realized as a fourth wire connected between the second capacitive element and the second output. In a further embodiment, the integrated circuit includes a metal substrate configured to provide the ground reference voltage node, wherein the first capacitive element and the second capacitive element are each disposed on the metal substrate, the first amplifier arrangement includes a first transistor disposed on the metal substrate, the first transistor including a first contact region for the first amplifier output, the first wire is connected between the first contact region and the first output, the second wire is connected between the first contact region and the first capacitive element, the second amplifier arrangement includes a second transistor mounted on the metal substrate, the second transistor including a second contact region for the second amplifier output, and the third inductive element is connected between the second contact region and the second capacitive element. In one embodiment, a trajectory of the second wire is oblique to a trajectory of the third wire.

In accordance with another embodiment, an apparatus for an integrated circuit includes a first node, a second node, a first amplifier configured to operate in Class AB mode, a second amplifier configured to operate in Class C mode, first impedance matching circuitry coupled between an output of the first amplifier and the first node, the first impedance matching circuitry being configured as a shunt inductance impedance matching circuit, and second impedance matching circuitry coupled between an output of the second amplifier and the second node, the second impedance matching circuitry being configured as a shunt capacitance impedance matching circuit. In one embodiment, the first impedance matching circuitry includes a first inductive element connected between the output of the first amplifier and the first node and a second inductive element connected between the output of the first amplifier and a first reference voltage node, and the second impedance matching circuitry includes a first capacitive element electrically connected to a ground reference voltage node for the integrated circuit, a third inductive element connected between the output of the second amplifier and the second capacitive element, and a fourth inductive element connected between the second capacitive element and the second node. In a further embodiment, the first impedance matching circuitry includes a second capacitive element coupled between the first reference voltage node and the ground reference voltage node. In one embodiment, a capacitance of the second capacitive element is configured to provide a virtual ground reference voltage for radio frequency signals at the output of the first amplifier at the first reference voltage node. In another embodiment, the second inductive element is realized as a first conductive wire having a first trajectory in a first direction, the third inductive element is realized as a second conductive wire having a second trajectory in the first direction, and a cross-section of the first trajectory along the first direction is different from a cross-section of the second trajectory along the first direction. In another embodiment, the first amplifier includes one or more transistors formed on a first die, the second amplifier includes one or more transistors formed on a second die, and a width of the second die is greater than a width of the first die.

In another embodiment, an amplifier system is provided. The amplifier system includes a main amplifier arrangement configured for a first class of operation, a peaking amplifier arrangement configured for a second class of operation that is different than the first class of operation, high-pass impedance matching circuitry coupled to an output of the main amplifier arrangement, and low-pass impedance matching circuitry coupled to an output of the peaking amplifier arrangement. In one embodiment, the amplifier system further comprises a power combiner having a first input and a second input, and a first impedance transforming element coupled between the first input and the first impedance matching circuitry, the second input being coupled to the second impedance matching circuitry. In a further embodiment, the amplifier system includes a power splitter having a first output and a second output, a first impedance matching element coupled between the second output and the peaking amplifier arrangement, the first impedance matching element including a quarter wave transformer, wherein the first output is coupled to the main amplifier arrangement.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty amplifier comprising:
    a first amplifier arrangement having a first amplifier input, a first amplifier output, and a first transistor that includes a first drain terminal corresponding to the first amplifier output, wherein the first amplifier input receives a first portion of a radio frequency (RF) input signal, the first amplifier arrangement amplifies the first portion of the RF input signal and provides an amplified first portion of the RF input signal at the first amplifier output, and the first amplifier arrangement is a main amplifier configured to operate in Class AB mode;
    first impedance matching circuitry directly coupled to the first drain terminal of the first transistor and to a first output of the circuit, wherein the first impedance matching circuitry comprises a high-pass impedance matching circuit topology that receives the amplified first portion of the RF input signal and produces a first output signal at the first output of the circuit;
    a second amplifier arrangement having a second amplifier output, a second amplifier input, and a second transistor that includes a second drain terminal corresponding to the second amplifier output, wherein the second amplifier input receives a second portion of the RF input signal, the second amplifier arrangement amplifies the second portion of the RF input signal and provides an amplified second portion of the RF signal at the second amplifier output, and the second amplifier arrangement is a peaking amplifier configured to operate in Class C mode; and
    second impedance matching circuitry directly coupled to the second drain terminal of the second transistor and to a second output of the circuit, wherein the second impedance matching circuitry comprises a low-pass impedance matching circuit topology that receives the amplified second portion of the RF input signal and produces a second output signal at the second output of the circuit, and wherein the Doherty amplifier is configured so that the second output signal at the second output of the circuit is shifted by 90 degrees relative to the first output signal at the first output of the circuit.

2. The Doherty amplifier of claim 1, wherein:
the first amplifier arrangement is configured to operate in a first mode of operation; and
the second amplifier arrangement is configured to operate in a second mode of operation that is different from the first mode of operation.

3. The Doherty amplifier of claim 1, wherein:
the first amplifier arrangement comprises a first transistor die having a first size corresponding to a first power handling capability; and
the second amplifier arrangement comprises a second transistor die having a second size that is different from the first size, wherein the second size corresponds to a second power handling capability that is different from the first power handling capability.

4. The Doherty amplifier of claim 3, wherein:
the second size and the second power handling capability are greater than the first size and the first power handling capability.

5. The Doherty amplifier of claim 3, wherein:
the first transistor die includes one transistor corresponding to the first transistor; and
the second transistor die includes one transistor corresponding to the second transistor.

6. The Doherty amplifier of claim 3, wherein:
the first transistor die includes more than one transistor, including the first transistor; and
the second transistor die includes more than one transistor, including the second transistor.

7. The Doherty amplifier of claim 1, further comprising:
a power splitter having a power splitter input, a first power splitter output coupled to the first amplifier input, and a second power splitter output coupled to the second amplifier input, wherein the power splitter input receives the RF input signal, the power splitter divides the RF input signal into the first and second portions of the RF input signal, the first power splitter output provides the first portion of the RF input signal, and the second power splitter output provides the second portion of the RF input signal.

8. The Doherty amplifier of claim 1, further comprising:
a power combiner having a first power combiner input coupled to the first amplifier output through the first impedance matching circuitry, a second power combiner input coupled to the second amplifier output through the second impedance matching circuitry, and a power combiner output, wherein the first power combiner input receives the first output signal, the second power combiner input receives the second output signal, and the power combiner combines the first and second output signals and provides an amplified version of the RF input signal at the power combiner output.

9. A Doherty amplifier comprising:
a first amplifier arrangement having a first amplifier input and a first amplifier output, wherein the first amplifier input receives a first portion of a radio frequency (RF) input signal, and the first amplifier arrangement amplifies the first portion of the RF input signal and provides an amplified first portion of the RF input signal at the first amplifier output;
first impedance matching circuitry coupled between the first amplifier output and a first output of the circuit, wherein the first impedance matching circuitry receives the amplified first portion of the RF input signal and produces a first output signal at the first output of the circuit, and the first impedance matching circuitry includes
 a first inductive element coupled between the first amplifier output and the first output,
 a second inductive element coupled to the first amplifier output, and
 a first capacitive element coupled between the second inductive element and a ground reference voltage node, such that the second inductive element and the first capacitive element are configured electrically in series between the first amplifier output and the ground reference voltage node;
a second amplifier arrangement having a second amplifier input and a second amplifier output, wherein the second amplifier input receives a second portion of the RF input signal, and the second amplifier arrangement amplifies the second portion of the RF input signal and provides an amplified second portion of the RF signal at the second amplifier output; and
second impedance matching circuitry coupled between the second amplifier output and a second output of the circuit, wherein the second impedance matching circuitry receives the amplified second portion of the RF input signal and produces a second output signal at the second output of the circuit, and wherein the Doherty amplifier is configured so that the second output signal at the second output of the circuit is shifted by 90 degrees relative to the first output signal at the first output of the circuit, wherein the second impedance matching circuitry includes
 a third inductive element coupled between the second amplifier output and a first node,
 a fourth inductive element coupled between the first node and the second output, and
 a second capacitive element coupled between the first node and the ground reference voltage node.

10. The Doherty amplifier of claim 9, wherein:
the first impedance matching circuitry comprises a high-pass impedance matching circuit topology; and
the second impedance matching circuitry comprises a low-pass impedance matching circuit topology.

11. The Doherty amplifier of claim 9, wherein:
the first inductive element comprises a first plurality of wires connected between the first amplifier arrangement and the first output;
the second inductive element comprises a second plurality of wires connected between the first amplifier arrangement and the first capacitive element;
the third inductive element comprises a third plurality of wires connected between the second amplifier arrangement and the second capacitive element; and
the fourth inductive element comprises a fourth plurality of wires connected between the second capacitive element and the second output.

12. The Doherty amplifier of claim 11, further comprising a metal substrate configured to provide the ground reference voltage node, wherein:
the first capacitive element and the second capacitive element are each disposed on the metal substrate;

the first amplifier arrangement comprises a first transistor disposed on the metal substrate, the first transistor including a first contact region for the first amplifier output;

the first plurality of wires is connected between the first contact region and the first output;

the second plurality of wires is connected between the first contact region and the first capacitive element;

the second amplifier arrangement comprises a second transistor mounted on the metal substrate, the second transistor including a second contact region for the second amplifier output; and the third inductive element is connected between the second contact region and the second capacitive element.

13. The Doherty amplifier of claim 11, wherein trajectories of the second plurality of wires is oblique to trajectories of the first plurality of wires.

14. The Doherty amplifier of claim 9, further comprising: a power splitter having a power splitter input, a first power splitter output coupled to the first amplifier input, and a second power splitter output coupled to the second amplifier input, wherein the power splitter input receives the RF input signal, the power splitter divides the RF input signal into the first and second portions of the RF input signal, the first power splitter output provides the first portion of the RF input signal, and the second power splitter output provides the second portion of the RF input signal.

15. The Doherty amplifier of claim 9, further comprising: a power combiner having a first power combiner input coupled to the first output of the circuit, a second power combiner input coupled to the second output of the circuit, and a power combiner output, wherein the first power combiner input receives the first output signal, the second power combiner input receives the second output signal, and the power combiner combines the first and second output signals and provides an amplified version of the RF input signal at the power combiner output.

16. A packaged electronic device comprising:
a substrate;
a first input package lead coupled to the substrate and configured to receive a first portion of a radio frequency (RF) input signal;
a second input package lead coupled to the substrate and configured to receive a second portion of the RF input signal;
a first output package lead coupled to the substrate;
a second output package lead coupled to the substrate;
a first transistor die that includes a first die input coupled to the first input package lead, and a first die output, wherein the first die input receives the first portion of the RF input signal, and the first transistor die amplifies the first portion of the RF input signal and provides an amplified first portion of the RF input signal at the first die output;
a second transistor die that includes a second die input coupled to the second input package lead, and a second die output, wherein the second die input receives the second portion of the RF input signal, and the second transistor die amplifies the second portion of the RF input signal and provides an amplified second portion of the RF input signal at the second die output;

first impedance matching circuitry coupled between the first die output and the first output package lead, wherein the first impedance matching circuitry receives the amplified first portion of the RF input signal and produces a first output signal at the first output package lead, and the first impedance matching circuitry includes
a first inductive element coupled between the first die output and the first output package lead,
a second inductive element coupled to the first die output, and
a first capacitive element coupled between the second inductive element and a ground reference voltage node, such that the second inductive element and the first capacitive element are configured electrically in series between the first die output and the ground reference voltage node; and second impedance matching circuitry coupled between the second die output and the second output package lead, wherein the second impedance matching circuitry receives the amplified second portion of the RF input signal and produces a second output signal at the second output package lead, and wherein the second impedance matching circuitry includes
a third inductive element coupled between the second die output and a first node,
a fourth inductive element coupled between the first node and the second output package lead, and
a second capacitive element coupled between the first node and the ground reference voltage node.

17. The packaged electronic device of claim 16, wherein:
the first impedance matching circuitry comprises a high-pass impedance matching circuit topology; and
the second impedance matching circuitry comprises a low-pass impedance matching circuit topology.

18. The packaged electronic device of claim 16, wherein:
the first inductive element comprises a first plurality of wires connected between the first die output and the first output package lead;
the second inductive element comprises a second plurality of wires connected between the first die output and the first capacitive element;
the third inductive element comprises a third plurality of wires connected between the second die output and the second capacitive element; and
the fourth inductive element comprises a fourth plurality of wires connected between the second capacitive element and the second output package lead.

19. The packaged electronic device of claim 16, wherein:
the substrate is a metal substrate configured to provide the ground reference voltage node.

* * * * *